United States Patent
Fan et al.

(10) Patent No.: US 11,431,939 B1
(45) Date of Patent: Aug. 30, 2022

(54) ANALOG TO DIGITAL CONVERTER CLOCK CONTROL TO EXTEND ANALOG GAIN AND REDUCE NOISE

(71) Applicant: OMNIVISION TECHNOLOGIES, INC., Santa Clara, CA (US)

(72) Inventors: Lihang Fan, Sunnyvale, CA (US); Nijun Jiang, Shanghai (CN); Liang Zuo, San Mateo, CA (US); Yuedan Li, Santa Clara, CA (US); Min Qu, Mountain View, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 17/217,935

(22) Filed: Mar. 30, 2021

(51) Int. Cl.
*H04N 5/378* (2011.01)
*H03M 1/18* (2006.01)
*H04N 5/357* (2011.01)
*H03M 1/12* (2006.01)
*H03M 3/00* (2006.01)

(52) U.S. Cl.
CPC ............. *H04N 5/378* (2013.01); *H03M 1/12* (2013.01); *H03M 1/18* (2013.01); *H03M 1/182* (2013.01); *H03M 3/458* (2013.01); *H04N 5/3575* (2013.01)

(58) Field of Classification Search
CPC ....... H04N 5/3575; H04N 5/378; H03M 1/12; H03M 1/18; H03M 1/182; H03M 3/458
See application file for complete search history.

(56) References Cited

U.S. PATENT DOCUMENTS

| 2004/0164809 | A1* | 8/2004 | Gibbs | ................. H03L 7/1976 331/1 A |
| 2010/0253560 | A1* | 10/2010 | Kudo | ..................... H04N 5/378 341/143 |
| 2016/0322979 | A1* | 11/2016 | Upadhyaya | ........... H03L 7/1974 |
| 2021/0351768 | A1* | 11/2021 | Fan | ......................... H03M 3/39 |

OTHER PUBLICATIONS

"15-25 MHz Fractional-N Synthesizer," http://www.aholme.co.uk/Frac2/Mash.htm, 5 pages, Andrew Holme, 2005.
(Continued)

*Primary Examiner* — Lin Ye
*Assistant Examiner* — Chriss S Yoder, III
(74) *Attorney, Agent, or Firm* — Perkins Coie LLP (57) ABSTRACT

A clock control circuit of an ADC includes a plurality of fractional divider circuits, each including a programmable integer divider coupled to receive an enable skew signal, a clock signal, and an output integer signal to divide down the clock signal by a factor responsive to the output integer signal to generate a fractional divider signal. A delta-sigma modulator is coupled to receive a fractional modulus signal, an input integer signal, and the fractional divider signal to generate the output integer signal, which is a varying signal each cycle and having a long term average DC value substantially equal to a fractional divider ratio K. An extended gain control circuit is coupled to receive the fractional divider signal from each of the fractional divider circuits to generate a plurality of ramp clock signals with adjustable frequencies to adjust a gain setting of a ramp generator of the ADC.

27 Claims, 4 Drawing Sheets

(56) References Cited

OTHER PUBLICATIONS

"Efficient Dithering in MASH Sigma-Delta Modulators for Fractional Frequency Synthesizers," IEEE Transactions on Circuits and Systems—I: Regular Papers, vol. 57, No. 9, Sep. 2010, 10 pages.
"New OmniVision 48MP Image Sensor Provides Unparalleled High Dynamic Range and 4K Video Performance for Flagship Mobile Phones," Jan. 6, 2020, 1 page.
"OV48C 48-megapixel product brief," Jan. 2020, 2 pages.
"Self-Dithered Digital Delta-Sigma Modulators for Fractional-N PLL," Zule Xu, Jun Gyu Lee, and Shoichi Masui, Research Institute of Electrical Communication, Tohoku University, 2011, 4 pages.
U.S. Appl. No. 16/867,399, Lihang Fan et al., "Ramp Generator Providing High Resolution Fine Gain Including Fractional Divider With Delta-Sigma Modulator," filed May 5, 2020, 38 pages.
U.S. Appl. No. 16/854,765, Lihang Fan et al., "Image Sensor With Shared Gray Code Generator and Parallel Colomn Arithmetic Logic Units," filed Apr. 21, 2020, 71 pages.

* cited by examiner

ANALOG TO DIGITAL CONVERTER CLOCK CONTROL TO EXTEND ANALOG GAIN AND REDUCE NOISE

BACKGROUND INFORMATION

Field of the Disclosure

This disclosure relates generally to image sensors, and in particular but not exclusively, relates to an analog to digital converters utilized in image sensors.

Background

Image sensors have become ubiquitous and are now widely used in digital cameras, cellular phones, security cameras, as well as medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to provide information that is representative of the external scene.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples of an analog to digital converter (ADC) including an ADC clock control circuit including a plurality of fractional dividers with an extended gain control circuit that extend analog gain and reduces noise in an imaging system are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship relative to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein are interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, an example ADC clock control circuit includes a plurality of fractional dividers with an extended gate control circuit, which provide a plurality of ramp clock signals having a plurality of different adjustable frequency settings to adjust an extended analog coarse gain (e.g., 16×, 32×, up to 64×) in accordance with the teachings of the present invention. In addition, an example ADC clock control circuit provides decreased delta-sigma modulator (DSM) noise for high resolution fine gain and lower quantization noise in low analog gains with an effectively doubled ADC counter clock frequency provided with an example in-phase/quadrature (I/Q) clock circuit in accordance with the teachings of the present invention.

Figure 1:
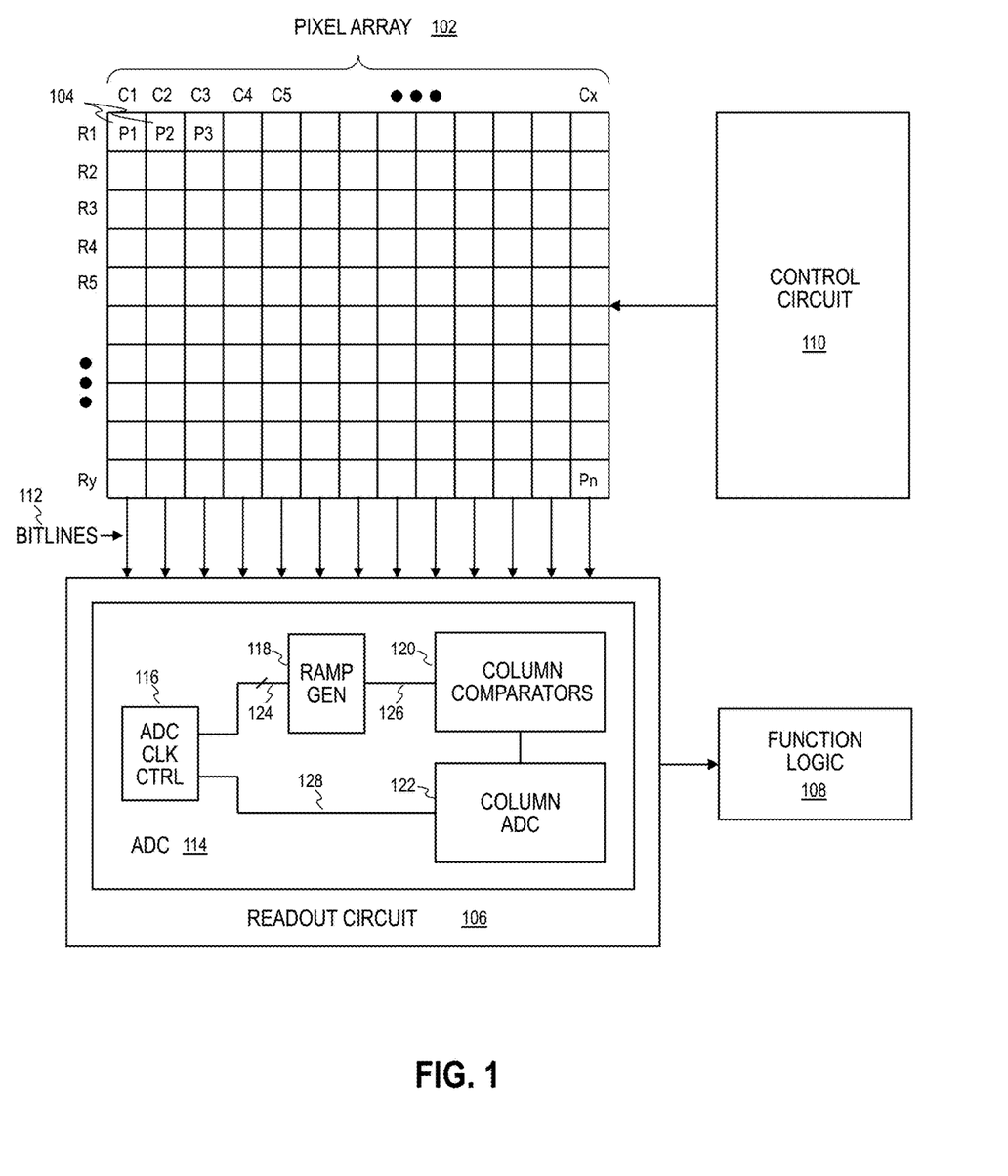
FIG. 1 illustrates one example of an imaging system including an image sensor with a readout circuit including an analog to digital converter (ADC) with extended analog gain and reduced noise utilizing an ADC clock control that provides a plurality of ramp clock signals to a ramp generator, and a counter clock signal provided to a column ADC in accordance with the teachings of the present invention.

To illustrate, FIG. 1 illustrates an imaging system including an image sensor 100 with a readout circuit that includes one example of an ADC with extended analog gain and reduced noise utilizing an example ADC clock control in accordance with the teachings of the present invention. As shown in the depicted example, imaging system 100 includes a pixel array 102, a control circuit 110, a readout circuit 106, and function logic 108. In one example, pixel array 102 is a two-dimensional (2D) array of pixel cells 104 that include one or more photodiodes (e.g., pixels P1, P2 . . . , Pn). As illustrated in the example, the pixel cells 104 are arranged into rows (e.g., rows R1 to Ry) and columns (e.g., column C1 to Cx) to acquire image data of a person, place, object, etc., which can then be used to render a 2D image of the person, place, object, etc. It is appreciated, however, that pixel cells 104 do not necessarily have to be arranged into rows and columns and may take other configurations.

In one example, control circuit 110 is coupled to pixel array 102 to control operation of the plurality of pixel cells 104 in pixel array 102. For example, control circuit 110 may generate a shutter signal for controlling image acquisition. In one example, the shutter signal is a global shutter signal for simultaneously enabling all pixel cells 104 within pixel array 102 to simultaneously capture their respective image data during a single acquisition window. In another example, the shutter signal is a rolling shutter signal such that each row, column, or grouping of pixel cells 104 is sequentially enabled during consecutive acquisition windows. In another example, image acquisition is synchronized with lighting effects such as a flash, etc.

In one example, imaging system 100 may be included in a digital camera, cell phone, laptop computer, or the like. Additionally, imaging system 100 may be coupled to other pieces of hardware such as a processor (general purpose or otherwise), memory elements, outputs (USB port, wireless transmitter, HDMI port, etc.), lighting/flash, electrical input devices (keyboard, touch display, trackpad, mouse, microphone, etc.), and/or display. Other pieces of hardware may deliver instructions to imaging system 100, extract image data from imaging system 100, and/or manipulate image data supplied by imaging system 100.

In one example, after each pixel cell 104 in pixel array 102 has acquired its image charge through photogeneration of the image charge in response to incident light, a corresponding image signal is read out by readout circuit 106 and then transferred to function logic 108. Readout circuit 106 may be coupled to readout image signals from the plurality of pixel cells 104 in pixel array 102. In the illustrated example, readout circuit 106 includes analog to digital conversion (ADC) circuitry 114, which is configured to generate digital image data in response to the image signals read out from the pixel array 102. Function logic 108 may be coupled to readout circuit 106 simply to store the image data, or even manipulate the image data by applying post image effects (e.g., crop, rotate, remove red eye, adjust brightness, adjust contrast, or otherwise). In one example, readout circuit 106 may read out a row of image data at a time along bitlines 112 (illustrated), or may read out the image data using a variety of other techniques (not illustrated), such as a serial readout or a full parallel readout of all pixel cells 104 simultaneously.

In the depicted example, the example ADC 114 included in readout circuit 106 includes an ADC clock control circuit 116 that is configure to generate a plurality of ramp clock signals 124 received by a ramp generator 118, and a counter clock signal 128 received by a column ADC 122. In the example, ADC 114 is a ramp type ADC that performs analog to digital conversion using a ramp signal 126 generated by the ramp generator 118, which provides a reference to column comparators 120, which are coupled to receive the image signals from pixel array 102 through column bitlines 112. For a ramp type ADC, a counter (not illustrated) starts to count when a ramp event in the ramp signal 126 begins and is compared to the analog image signal from the bitline 112. At the point when the ramp signal 126 and the analog image signal from bitline 112 are equal, the value of the counter is latched as digital image data representation of the analog image signal.

As will be discussed, in one example, in order to realize an image sensor with high resolution analog to digital conversion, the gain is adjusted by adjusting the slope of the ramp signal 126. The gain provided with the ramp signal 126 is ratio of the ramp slope, which is defined in Equation (1) below:

$$\text{Gain} = \frac{(\text{Slope})|_{gain=1}}{\text{Slope}} \qquad (1)$$

Thus, the gain provided by the ramp signal 126 is equal to the slope of a ramp signal that provides a gain of 1 divided by the slope of the ramp signal. In other words, the gain is inversely proportional to the slope as indicated Equation (2) below:

$$\text{Gain} \propto \frac{1}{\text{Slope}} \qquad (2)$$

In the various examples, analog coarse gain (e.g., 1×, 2×, 4×, 8×) may be implemented in the column comparators, and extended coarse gain (e.g., 16×, 32× adjustments) may be achieved with example extended gain control circuitry included in the ADC clock control circuit 116, which generates a plurality of ramp clock signals that have a plurality of different adjustable frequency settings to adjust the extended coarse gain setting in accordance with the teachings of the present invention.

In the various examples, analog fine gain adjustments are implemented with a plurality of fractional dividers including delta-sigma modulators (DSM) in the ADC clock control circuit 116 in the in accordance with the teachings of the present invention. In particular, by utilizing frequency dividers with DSM modulators to generate the ramp clock signals 124, ultra-high resolution fine gain steps may be realized in the ramp generator 118 by adjusting the fractional divider ratio K in accordance with the teachings of the present invention.

Figure 2A:
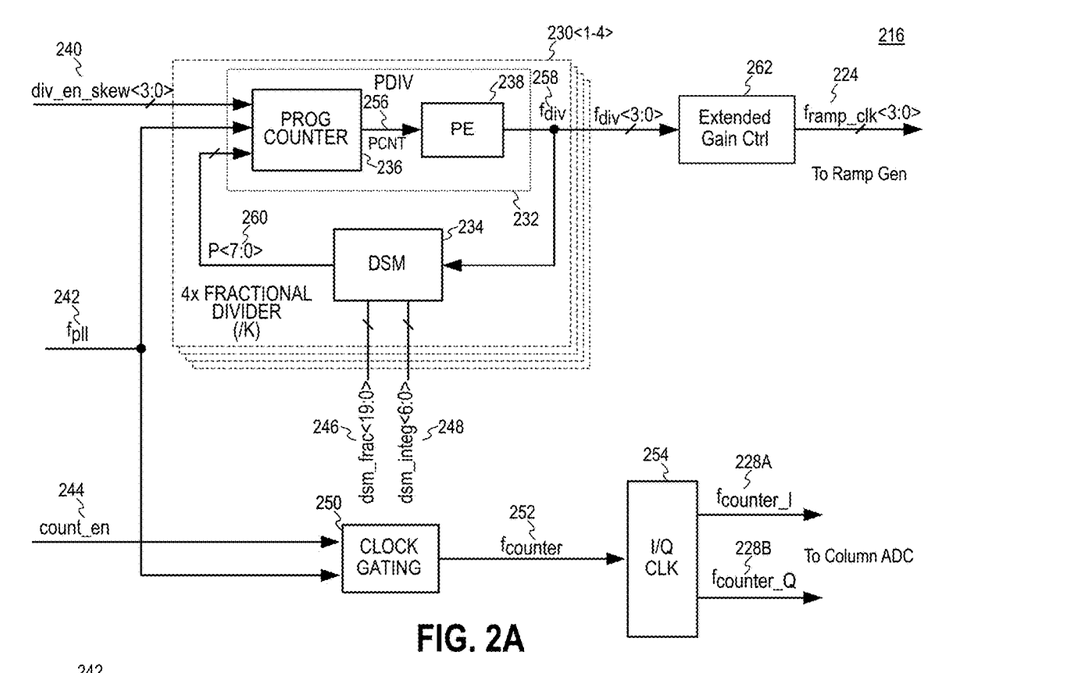
FIG. 2A illustrates a schematic that shows one example diagram of a plurality of fractional dividers coupled to an extended gain control circuit providing extended analog gain in accordance with the teachings of the present invention.

To illustrate, FIG. 2A shows one example of an ADC clock control circuit 216 including a plurality of fractional dividers coupled to an extended gain control circuit providing extended analog gain in accordance with the teachings of the present invention. It is appreciated the ADC clock control circuit 216 of FIG. 2A may be one example of the ADC clock control circuit 116 in readout circuit 106 of the image sensor 100 as shown in FIG. 1, and that similarly named and numbered elements described above are coupled and function similarly below.

As shown in the example, ADC clock control circuit 216 includes a plurality of fractional divider circuits 230 coupled to receive enable skew signals div_en_skew<3:0> 240 and a clock signal $f_{pll}$ 242 to generate a plurality of fractional divider signals $f_{div}$<3:0> 258. In the depicted example, the amount of skew in fractional divider signals $f_{div}$<3:0> 258 can be adjusted by controlling the enable skew signals div_en_skew<3:0> 240. In the depicted example, ADC clock control circuit 216 includes four fractional divider circuits to generate four fractional divider signals $f_{div}$ 258. In the example, each of the fractional divider circuits 230 includes a programmable integer divider 232 coupled to receive an enable skew signal div_en_skew 240, the clock signal $f_{pll}$ 242, and an output integer signal P<7:0> 260. In operation, the programmable integer divider 232 is coupled to divide down the clock signal $f_{pll}$ 242 by a factor responsive to the output integer signal output integer signal P<7:0> 260 to generate the respective fractional divider signal $f_{div}$ 258.

In the example depicted in FIG. 2A, the programmable integer divider 232 of the fractional divider circuit 230 includes a programmable counter 236 coupled to receive enable skew signal div_en_skew 240, clock signal $f_{pll}$ 242, and output integer signal P<7:0> 260 to generate a programmable counter output signal PCNT 256. In the example, the programmable counter output signal PCNT 256 includes a plurality of pulses. A pulse width extender 238 is coupled to receive the programmable counter output signal PCNT 256 to generate the fractional divider signal $f_{div}$ 258. In operation, the pulse width extender 238 is configured to extend each one of the plurality of pulses in the fractional divider signal $f_{div}$ 258 to a fixed duration for each first state (e.g., '1' state or logic "high") of the fractional divider signal $f_{div}$ 258, and each second state (e.g., '0' state or logic "low") of the fractional divider signal $f_{div}$ 258 has a variable duration.

Continuing with the example illustrated in in FIG. 2A, delta-sigma modulator 234 is coupled to receive a fractional modulus signal dsm_frac<19:0> 246, an input integer signal dsm_integ<6:0> 248, and the fractional divider signal $f_{div}$ 258 to generate the output integer signal P<7:0> 260. In operation, the output integer signal P<7:0> is a varying signal each cycle of the fractional divider signal $f_{div}$ 258 and has a long term average DC value substantially equal to a fractional divider ratio K.

In the illustrated example, an extended gain control circuit 262 is coupled to receive the fractional divider signals $f_{div}$<3:0> 258 from each of the plurality of fractional divider circuits 230. In operation, the extended gain control circuit 262 is configured to generate a plurality of ramp clock signals $f_{ramp\_clk}$<3:0> 224 in response to each respective fractional divider signal $f_{div}$ 258 from each one of the plurality of fractional divider circuits 230. As will be discussed in greater detail below, in one example, the plurality of ramp clock signals $f_{ramp\_clk}$<3:0> 224 generated by extended gain control circuit 262 are coupled to be received by the ramp generator 118. The frequencies of the plurality of ramp clock signals $f_{ramp\_clk}$<3:0> 224 may be set or adjusted to one of a plurality of different frequency settings to adjust an extended analog coarse gain setting of a ramp generator 118 of the ADC 114, while analog fine gain adjustments are adjusted with fractional divider ratio K of the plurality of fractional dividers<1-4> 230 as will be discussed in further detail below in accordance with the teachings of the present invention.

Continuing with the example depicted in FIG. 2A, a clock gating circuit 250 is also coupled to receive the clock signal $f_{pll}$ 242 and a count enable signal count_en 244. In operation, the clock gating circuit 250 is configured to gate the clock signal $f_{pll}$ 242 in response to the count enable signal count_en 244 to generate a counter clock signal $f_{counter}$ 252 in response to the clock signal $f_{pll}$ 242 and the count enable signal count_en 244.

As shown in the depicted example, an in-phase/quadrature (I/Q) clock circuit 254 is coupled to receive the counter clock signal $f_{counter}$ 252 from the clock gating circuit 250. In the example, the I/Q clock circuit 254 is configured to generate an in-phase counter clock signal $f_{counter\_I}$ 228A and a quadrature counter clock signal $f_{counter\_Q}$ 228B in response to the counter clock signal $f_{counter}$ 252, which as will be discussed below are coupled to be received by the column ADC 122 to generate a counter clock signal of the column ADC in response. In another example, it is appreciated that a I/Q clock circuit may be included within the column ADC 122, and that the counter clock signal $f_{counter}$ 252 is therefore coupled to be received by the I/Q clock circuit within the column ADC 122 to generate the counter clock signal in response.

As will be described in greater detail below, in one example, the in-phase counter clock signal $f_{counter\_I}$ 228A generated by the I/Q clock circuit 254 is a counter clock signal that has pulses with rising edges that are in-phase with rising edges of pulses of the counter clock signal $f_{counter}$ 252. In one example, the frequency of the in-phase counter clock signal $f_{counter\_I}$ 228A generated by the I/Q clock circuit 254 is half of the frequency of the counter clock signal $f_{counter}$ 252. In the example, the quadrature counter clock signal $f_{counter\_Q}$ 228B generated by the I/Q clock circuit 254 has the same frequency as the in-phase counter clock signal $f_{counter\_I}$ 228A, but is phase-shifted relative to the in-phase counter clock signal $f_{counter\_I}$ 228A by a quarter of a cycle or 90° (i.e., π/2 radians). As will be discussed, in one example, the column ADC 122 utilizes the in-phase counter clock signal $f_{counter\_I}$ 228A and the quadrature counter clock signal $f_{counter\_Q}$ 228B to generate a Gray code count for the counter clock signal within the column ADC 122 in accordance with the teachings of the present invention. It is noted that with the generation of the in-phase counter clock signal $f_{counter\_I}$ 228A and the quadrature counter clock signal $f_{counter\_Q}$ 228B by the I/Q clock circuit 254, an effective 2× increase in counting speed for the counter in the column ADC 122 is realized in accordance with the teachings of the present invention.

Figure 2B:
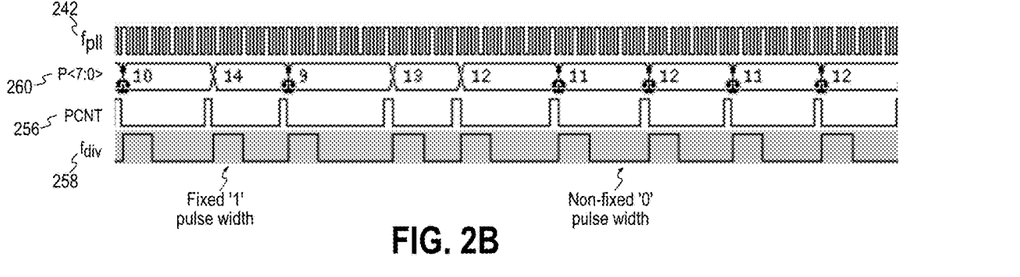
FIG. 2B shows one example of signals in a fractional divider with a delta-sigma modulator in accordance with the teachings of the present invention.

FIG. 2B shows one example of signals in a fractional divider 230 with a delta-sigma modulator 234 in accordance with the teachings of the present invention. As shown in FIG. 2B, the clock signal $f_{pll}$ 242 is a high frequency pulse train of short pulses. The output integer signal P<7:0> 260 generated by the delta-sigma modulator 234 is a varying integer value signal each cycle of the fractional divider signal $f_{div}$ 258. The long term average DC value over time of output integer signal P<7:0> 260 is substantially equal to the fractional divider ratio K. The programmable counter output signal PCNT 256 is a plurality of short pulses, which in the illustrated example have a pulse width equal to 1 input clock cycle of the clock signal $f_{pll}$ 242. The fractional divider signal $f_{div}$ 258 is generated by pulse width extender 238 in response to the programmable counter output signal PCNT 256. In the example, the pulse width extender 238 extends each short pulse of the programmable counter output signal PCNT 256 to a certain fixed '1' pulse width.

Figure 2C:
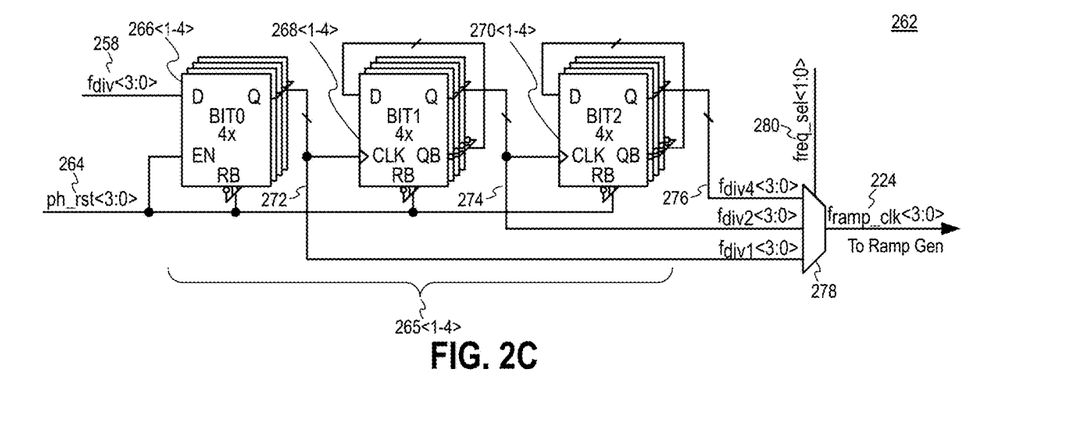
FIG. 2C illustrates a schematic that shows one example diagram of an extended gain control circuit including a plurality of ripple counters providing a plurality of ramp clock signals having a plurality of different adjustable frequency settings in accordance with the teachings of the present invention.

FIG. 2C illustrates a schematic that shows one example diagram of an extended gain control circuit 262 in accordance with the teachings of the present invention. It is appreciated the extended gain control circuit 262 of FIG. 2C may be one example of the extended gain control circuit 262 as shown in FIG. 2A, and that similarly named and numbered elements described above are coupled and function similarly below. As shown in the illustrated example, extended gain control circuit 262 includes a plurality of ripple counters 265<1-4>, which are configured to provide a plurality of ramp clock signals $f_{ramp\_clk}$<3:0> 224 in response to fractional divider signals $f_{div}$<3:0> 258 received from each one of the plurality of fractional divider circuits 230<1-4>. In the example, the plurality of ramp clock signals $f_{ramp\_clk}$<3:0> 224 have adjustable frequencies, which can be set or adjusted in response to a frequency select signal freq_sel<1:0> 280 to adjust an analog coarse gain setting of the ramp generator 118 of the ADC 114 in accordance with the teachings of the present invention.

In the illustrated example, the plurality of ripple counters 265<1-4> includes four ripple counters coupled in parallel with each one coupled to receive a respective one of the frequency divider signals $f_{div}$<3:0> from the respective one of the plurality of fractional divider circuits 230<1-4>. In the example, the plurality ripple counter 265<1-4> includes a plurality of respective cascade-coupled flip flops 266<1-4>, 268<1-4>, and 270<1-4> as shown. In the example depicted in FIG. 2C, the flip flops 266<1-4>, 268<1-4>, and 270<1-4> of each one of the plurality of ripple counters 265<1-4> are implemented with D flip flops.

In various examples, each one of the plurality of ripple counters 265<1-4> is configured to generate an N bit ripple counter output. In the example illustrated in FIG. 2C, N=3 such that each one of the plurality of ripple counters 265<1-4> is configured to generate a 3 bit ripple counter output. As such, the first bit (e.g., BIT0) of the 3 bit ripple counter outputs of the plurality of ripple counters 265<1-4> is generated by first flip flops 266<1-4>, the second bit (e.g., BIT1) of the 3 bit ripple counter outputs of the plurality of ripple counters 265<1-4> is generated by second flip flops 268<1-4>, and the third bit (e.g., BIT2) of the 3 bit ripple counter outputs of the plurality of ripple counters 265<1-4> is generated by third flip flops 270<1-4>.

As shown, the first flip flops 266<1-4> have D inputs coupled to receive the fractional divider signals $f_{div}$<3:0> 258 from each one of the plurality of fractional divider circuits 230<1-4>. The Q outputs of the first flip flops 266<1-4> are configured to generate the first bit (e.g., BIT0) outputs, which are labeled $f_{div1}$<3:0> 272.

The second flip flops 268<1-4> have clock inputs coupled to receive the $f_{div1}$<3:0> 272 outputs from first flip flops 266<1-4>. The second flip flops 268<1-4> have D inputs coupled to the inverted outputs (e.g., 'QB') of the second flip flops 268<1-4>, and the non-inverted Q outputs of the second flip flops 268<1-4> are configured to generate the second bit (e.g., BIT1) outputs, which are labeled $f_{div2}$<3:0> 274.

The third flip flops 270<1-4> have clock inputs coupled to receive the $f_{div2}$<3:0> 274 outputs from second flip flops 268<1-4>. The third flip flops 270<1-4> have D inputs coupled to the inverted outputs (e.g., 'QB') of the third flip flops 270<1-4>, and the non-inverted Q outputs of the third flip flops 270<1-4> are configured to generate the third bit (e.g., BIT2) outputs, which are labeled $f_{div4}$<3:0> 276.

In the example, a frequency of the second bits BIT1 (i.e., $f_{div2}$<3:0> 274) is half a frequency of the first bits BIT0 (i.e., $f_{div1}$<3:0> 272), and a frequency of the third bits BIT2 (i.e., $f_{div4}$<3:0> 276) is half the frequency of the second bits BIT1 (i.e., $f_{div2}$<3:0> 274). In the example, the first flip flops 266<1-4>, the second flip flops 268<1-4>, and the third flip flops 270<1-4> of each ripple counter 265<1-4> are further configured to receive a reset signal ph_rst<3:0> to reset each ripple counter 265<1-4>. In the particular, the example illustrated in FIG. 2C shows that the first flip flops 266<1-4> have a reset input RB and an enable input EN coupled to receive reset signal ph_rst<3:0>, the second flip flops 268<1-4> have a reset input RB coupled to receive reset signal ph_rst<3:0>, and the third flip flops 270<1-4> have a reset input RB coupled to receive reset signal ph_rst<3:0>.

As shown in the depicted example, a multiplexer 278 is coupled receive the first bits BIT0 (i.e., $f_{div1}$<3:0> 272) from the first flip flops 266<1-4>, second bits BIT1 (i.e., $f_{div2}$<3:0> 274) from the second flip flops 268<1-4>, and third bits BIT2 (i.e., $f_{div4}$<3:0> 276) from the third flip flops 270<1-4>. The multiplexer 278 is also coupled to receive a frequency select signal freq_sel<1:0>280. In operation, the multiplexer 278 is configured to select one of the respective bits (first bits BIT0 $f_{div1}$<3:0> 272), second bits BIT1 $f_{div2}$<3:0> 274), or third bits BIT2 $f_{div4}$<3:0> 276) from the plurality of cascaded flip flops 266<1-4>, 268<1-4>, 270<1-4> of the plurality of ripple counters 265<1-4> in response to a frequency select signal freq_sel<1:0> 280 to generate the plurality of ramp clock signals $f_{ramp\_clk}$<3:0> 224, which is coupled to be received by the ramp generator 118. As mentioned, an analog coarse gain of the ramp generator 118 is set or adjusted in response to the selected frequency of the plurality of ramp clock signals $f_{ramp\_clk}$<3:0> 224 in accordance with the teachings of the present invention.

Figure 3A:
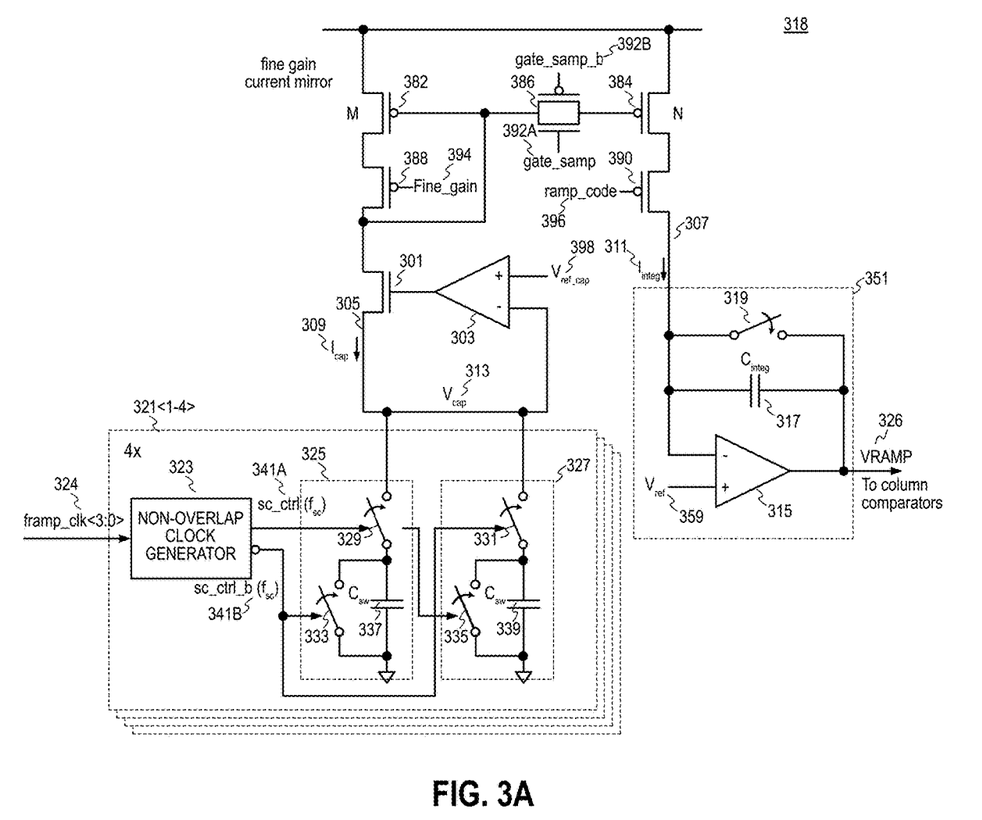
FIG. 3A illustrates a one example of a ramp generator using a plurality of ramp clock signals from an extended gain control circuit coupled to a plurality of fractional dividers in accordance with the teachings of the present disclosure.

FIG. 3A illustrates a one example of a ramp generator 318 in accordance with the teachings of the present disclosure. It is appreciated the ramp generator 318 of FIG. 3A may be one example of the ramp generator 118 as shown in FIG. 1 or the ramp generator coupled to receive the plurality of ramp clock signals $f_{ramp\_clk}$<3:0> 224 generated by the extended gain control circuit 262 discussed in FIGS. 2A and 2C, and that similarly named and numbered elements described above are coupled and function similarly below. In the depicted example, it is appreciated that ramp generator 318 has high resolution analog fine gain using the plurality of ramp clock signals $f_{ramp\_clk}$<3:0> 224 generated by the plurality of fractional dividers with delta-sigma modulators in accordance with the teachings of the present disclosure.

As shown in the illustrated example, ramp generator 318 includes a fine grain current mirror that includes transistors 382 and 384, which have their gate terminals coupled to each other through a gate sampling switch 386 as shown. In the example, transistors 382 and 384 are P channel metal oxide semiconductor field effect transistors (MOSFETs). In other examples, it is appreciated that other that other types of transistors may be utilized to realize a current mirror. In the example, the source terminal of transistor 382 is coupled a voltage supply rail and the gate and drain terminals of transistor 382 are coupled together through a fine grain transistor 388. In the example, the gate sampling switch is controlled in response to a gate sampling signal gate_samp 392A and an inverted gate sampling signal gate_samp_b 392B. The fine gain transistor 388 is controlled in response to a fine gain control signal Fine_gain 394. The source terminal of transistor 384 is coupled to the voltage supply rail. As such the current mirror has a first current mirror path 305 coupled to transistor 382 and a second current mirror path 307 coupled to transistor 384. In the example, the transistor 382 has a relative channel width proportional to M and the transistor 384 has a relative channel width proportional to N. As such, a capacitor current $I_{cap}$ 309 is conducted through the first path 305 and a mirrored integrator current $I_{integ}$ 311 is conducted through the second path 307 according to the N/M ratio of the first and second transistors 382 and 384.

The depicted example illustrates that ramp generator 314 includes an integrator 351 coupled to transistor 384 through a ramp code transistor 390 through the current path 307 to generate the ramp signal VRAMP 326 in response to the integrator current $I_{integ}$ 311. In the example, the ramp code transistor is coupled to be controlled in response to a ramp code signal ramp_code 396. In one example, the ramp signal VRAMP 326 is coupled to be received by column comparators, such as column comparators 120 illustrated in FIG. 1. As shown in the example illustrated in FIG. 3A, the integrator 351 includes an operational amplifier 315 having a non-inverting input coupled to a reference voltage $V_{ref}$ 359. A capacitor $C_{integ}$ 317 is coupled between an inverting input of the operational amplifier 315 and an output of the operational amplifier 315. A switch 319 is coupled between the inverting input of the operational amplifier 315 and the output of the operational amplifier 315. The integrator 351 is coupled to be reset in response to closing the switch 319, and each ramp event in the ramp signal VRAMP 326 is coupled to be begin at the output of the operational amplifier 315 when the switch 319 is opened.

In the illustrated example, ramp generator 318 also includes an operational amplifier 303 having a non-inverting input coupled to a reference capacitor voltage $V_{ref\_cap}$ 398. A transistor 301 is coupled between the transistor 382 (through transistor 388) and a plurality of switching circuits 321<1-4>, which will be described in greater detail below, and the inverting input of the operational amplifier 303 through the current path 305. The control terminal (e.g., gate) of the transistor 301 is coupled to an output of the operational amplifier 303. Accordingly, the operational amplifier 303 is configured to regulate the gate voltage of the transistor 301 in response to a voltage $V_{cap}$ 313 at the plurality of switching circuits 321<1-4> reaching the reference capacitor voltage $V_{ref\_cap}$ 398. As such, the operational amplifier 303 and the transistor 301 are configured to regulate the charging capacitor current $I_{cap}$ 309 through the current path 305 and therefore regulate the $V_{cap}$ 313 voltage at the plurality of switching circuits 321<1-4> to the $V_{ref\_cap}$ 398 reference voltage.

As shown in the example depicted in FIG. 3A, the illustrated plurality of switching circuits 321<1-4> is coupled to the first path 305 and the inverting input of operational amplifier 303. In the illustrated example, the plurality of switching circuits 321<1-4> includes four switching circuits 321, each one coupled to receive a respective one of the ramp clock signals $f_{ramp\_clk}$<3:0> from the extended gain control circuit 262. Each one of the switching circuits 321 includes a first switched capacitor circuit 325 and a second switched capacitor circuit 327 coupled to the first path 305 and a non-overlap clock generator 323 coupled to receive a respective one of the plurality of ramp clock signals $f_{ramp\_clk}$ 324<3:0>.

In operation, the non-overlap clock generator 323 is configured to generate a first switched capacitor control signal sc_ctrl ($f_{sc}$) 341A that oscillates between a first state (e.g., '1') and a second state (e.g., '0'), and a second switched capacitor control signal sc_ctrl_b ($f_{sc}$) 341B that oscillates between the second state and the first state. As will be discussed, the first switched capacitor circuit 325 is coupled to be charged by the capacitor current $I_{cap}$ 309 and the second switched capacitor circuit 327 is coupled to be discharged in response to each first state of the first switched capacitor control signal sc_ctrl ($f_{sc}$) 341A and each second state of the second switched capacitor control signal sc_ctrl_b ($f_{sc}$) 341B. Similarly, the first switched capacitor circuit 325 is coupled to be discharged and the second switched capacitor circuit is coupled to be charged by the capacitor current $I_{cap}$ 309 in response to each second state of the first switched capacitor control signal sc_ctrl ($f_{sc}$) 341A and each first state of the second switched capacitor control signal sc_ctrl_b ($f_{sc}$) 341B.

As shown in the illustrated example, each first switched capacitor circuit 325 includes a first capacitor $C_{sw}$ 337, a first switch 329 coupled between the first capacitor $C_{sw}$ 337 and the first path 305, and a second switch 333 coupled across the first capacitor $C_{sw}$ 337. In operation, the first switch 329 is configured to be turned on in response to the first state of the first switched capacitor control signal sc_ctrl ($f_{sc}$) 341A and turned off in response to the second state of the first switched capacitor control signal sc_ctrl ($f_{sc}$) 341A. The second switch 333 is configured to be turned off in response to the second state of the second switched capacitor control signal sc_ctrl_b ($f_{sc}$) 341B and turned on in response to the first state of the second switched capacitor control signal sc_ctrl_b ($f_{sc}$) 341B.

Continuing with the depicted example, each second switched capacitor circuit 327 includes a second capacitor $C_{sw}$ 339, a third switch 331 coupled between the second capacitor $C_{sw}$ 339 and the first path 305, and a fourth switch 335 coupled across the second capacitor $C_{sw}$ 339. In operation, the third switch 331 is configured to be turned off in response to the second state of the second switched capacitor control signal sc_ctrl_b ($f_{sc}$) 341B and turned on in response to the first state of the second switched capacitor control signal sc_ctrl_b ($f_{sc}$) 341B. The fourth switch 335 is configured to be turned on in response to the first state of the first switched capacitor control signal sc_ctrl ($f_{sc}$) 341A and turned off in response to the second state of the first switched capacitor control signal sc_ctrl ($f_{sc}$) 341A.

In one example, the non-overlap clock generator 323 is configured to generate the second switched capacitor control signal sc_ctrl_b ($f_{sc}$) 341B in response to the first switched capacitor control signal sc_ctrl ($f_{sc}$) 341A such that only one of the two signals can be in the first state (e.g., '1') at a time. In one example, the first switched capacitor control signal sc_ctrl ($f_{sc}$) 341A and the second switched capacitor control signal sc_ctrl_b ($f_{sc}$) 341B are complements of each other, or in another example the first switched capacitor control signal sc_ctrl ($f_{sc}$) 341A and the second switched capacitor control signal sc_ctrl_b ($f_{sc}$) 341B are out of phase with one another such that neither of the two signals can ever be in the first state at the same time. In addition, both the first switched capacitor control signal sc_ctrl ($f_{sc}$) 341A and the second switched capacitor control signal sc_ctrl_b ($f_{sc}$) 341B have the same frequency of $f_{sc}$.

Therefore, in the example depicted in FIG. 3A, switches 329 and 335 are both coupled to be turned on in response to first switched capacitor control signal sc_ctrl ($f_{sc}$) 341 being in the first state to charge first capacitor $C_{sw}$ 337 and discharge second capacitor $C_{sw}$ 339. At the same time switches 333 and 331 are both coupled to be turned off in response to second switched capacitor control signal sc_ctrl_b ($f_{sc}$) 341B being in the second state to enable first capacitor $C_{sw}$ 337 to be charged and to decouple second capacitor $C_{sw}$ 339 from being charged. Similarly, switches 333 and 331 are coupled to be turned on in response to second switched capacitor control signal sc_ctrl_b ($f_{sc}$) 341B being in the first state to discharge first capacitor $Cs_w$337 and to charge second capacitor $C_{sw}$ 339. At the same time, switches 329 and 335 are coupled to be turned off in response to first switched capacitor control signal sc_ctrl ($f_{sc}$) 341A being in the second state to decouple first capacitor $C_{sw}$ 337 from being charged and enable second capacitor $C_{sw}$ 339 to be charged. Therefore, capacitors $C_{sw}$ 337 and $C_{sw}$ 339 are alternatingly charged and discharged in response to first switched capacitor control signal sc_ctrl ($f_{sc}$) 341A and second switched capacitor control signal sc_ctrl_b ($f_{sc}$) 341B.

It is appreciated that one key consideration of the fixed '1' pulse width of each pulse in the first switched capacitor control signal sc_ctrl ($f_{sc}$) 341A and the second switched capacitor control signal sc_ctrl_b ($f_{sc}$) 341B is to maintain good linearity and ensure that each capacitor $C_{sw}$ 337 and $C_{sw}$ 339 of switched capacitor circuits 325 and 327 in FIG. 3A can be fully charged within each fixed pulse width for each '1' pulse and fully discharged within each non-fixed or variable pulse width for each '0' pulse of the first switched capacitor control signal sc_ctrl ($f_{sc}$) 341A and second switched capacitor control signal sc_ctrl_b ($f_{sc}$) 341B.

In the various examples, the first switched capacitor control signal sc_ctrl ($f_{sc}$) 341A and second switched capacitor control signal sc_ctrl_b ($f_{sc}$) 341B generated by non-overlap clock generator 323 in response to the plurality of ramp clock signals $f_{ramp\_clk}$<3:0> 324, which are generated by the extended gain control circuit 262 discussed in FIGS. 2A and 2C, have a skewed duty cycle, while maintaining the fixed width '1' pulse and the non-fixed or variable pulse width '0' pulse as shown for example in FIG. 2B with respect to the frequency divider signal $f_{div}$ 258. Thus, in various examples, the minimum period for each period of first switched capacitor control signal sc_ctrl ($f_{sc}$) 341A and second switched capacitor control signal sc_ctrl_b ($f_{sc}$) 341B is at least twice the width of the fixed '1' pulse width. Stated in another way, in one example, the maximum the duty cycle for each period of first switched capacitor control signal sc_ctrl ($f_{sc}$) 341A and second switched capacitor control signal sc_ctrl_b ($f_{sc}$) 341B is 50%.

In operation, ultra-high resolution analog fine gain is realized with ramp generator 318 the plurality of ramp clock signals $f_{ramp\_clk}$<3:0> 324. As discussed in detail above, the plurality of ramp clock signals $f_{ramp\_clk}$<3:0> 324 are generated in response to the plurality of fractional dividers 230<1-4>, which include a delta-sigma modulators 234, to generate the first switched capacitor control signal sc_ctrl ($f_{sc}$) 341A and the second switched capacitor control signal sc_ctrl_b ($f_{sc}$) 341B to control the switching of the switched capacitor circuits 325 and 327 that include capacitors $C_{sw}$ 337 and 356, respectively. As will be discussed, the ultra-high resolution analog fine gain is achieved by changing the charging capacitor current $I_{cap}$ 309 in response to adjusting the fractional divider ratio K of the fractional dividers 230<1-4> in accordance with the teachings of the present invention.

In the example, the charging capacitor current $I_{cap}$ 309 is generated by the switching of the switched capacitor circuits 325 and 327. In particular, the charging capacitor current $I_{cap}$ 309 is defined in Equation (3) below:

$$I_{cap} = f_{sc} C_{sw} V_{cap} \qquad (3)$$

where the first switched capacitor control signal sc_ctrl ($f_{sc}$) 341A and the second switched capacitor control signal sc_ctrl_b ($f_{sc}$) 341B have a switching frequency of $f_{sc}$, the capacitance values of first and second capacitors $C_{sw}$ 337 and $C_{sw}$ 339 are both equal to $C_{sw}$, and the voltage across first and second capacitors $C_{sw}$ 337 and $C_{sw}$ 339 of the switched capacitor circuits 325 and 327 is $V_{cap}$. Since the current $I_{cap}$ 309 through first path 305 is mirrored to second path 307 with the current mirror, the integrator current $I_{integ}$ 311 is defined in Equation (4) below:

$$I_{integ} = \frac{N}{M} f_{sc} C_{sw} V_{cap} = \frac{N}{M} \frac{f_{pll}}{K} C_{sw} V_{cap} \qquad (4)$$

where N represents the relative channel width of transistor 384, M represents the relative channel width of transistor 382, $f_{pll}$ is the frequency of the clock signal $f_{pll}$ 242 received by the fractional divider circuits 230<1-4>, and K is the adjustable fractional divider ratio of the fractional divider circuits 230<1-4>. Assuming $V_{cap}$ 313, $C_{sw}$, N, and M are constant, then ultra-high resolution fine gain is realized by ramp generator circuit 318 by adjusting fractional divider ratio K. As such, the gain of the ramp generator circuit 318 is defined by the relationship of Equation (5) below:

$$\text{Gain} = \frac{K}{K|_{gain=1}} \qquad (5)$$

Thus, assuming for example a fractional divider ratio K=8 provides a fine gain equal to 1, then a fractional divider ratio K=16 would provide a gain of 16/8=2 according to Equation (5). Similarly, a gain of 1 1/32 is provided with K=8.25 since 8.25/8=1 1/32, a gain of 1 2/32 is provided with K=8.5 since 8.5/8=1 2/32, and so on.

Referring briefly back to FIG. 2A, in one example, the accumulators included in delta-sigma modulator 234 are cascaded 20-bit overflowing accumulators. Thus, the fractional divider ratio K can be defined with Equation (6) as follows:

$$K = P_{avg} = \text{dsm\_integ} \langle 6:0 \rangle + \frac{\text{dsm\_frac} \langle 19:0 \rangle}{2^{20}} \qquad (6)$$

where $P_{avg}$ is an integer number whose long term DC average value is the fractional divider ratio K, dsm_integ<6:0> is an input integer signal, and dsm_frac<19:0> is a fractional modulus signal. Therefore, the long term average frequency $f_{sc,avg}$ of the first and second switched capacitor control signals sc_ctrl 341A and sc_ctrl_b 341B used to clock the ramp generator 318 can be determined according to Equation (7) as follows:

$$f_{sc,avg} = \frac{f_{pll}}{P_{avg}} = \frac{f_{pll}}{K} \quad (7)$$

where $f_{pll}$ is the switching frequency of the clock signal $f_{pll}$ 242 received by the plurality of fractional dividers 230<1-4>. Therefore, ultra-high resolution fine gain is realized by ramp generator circuit 318 by adjusting fractional divider ratio K in accordance with the teachings of the present invention.

Referring back to FIG. 3A, it is appreciated that the extended coarse analog gain of ramp generator circuit 318 can be adjusted by adjusting the integrator current $I_{integ}$ 311, which can be adjusted by controlling the frequencies of the plurality of ramp clock signals $f_{ramp\_clk}$<3:0> 324 or controlling the capacitance $C_{sw}$ of the first and second switched capacitor circuits 325 and 327 in accordance with the teachings of the present invention. In particular, as summarized above, the integrator current $I_{integ}$ 311 can be determined according to Equation (4) above, which can be re-expressed with respect to the frequency of the plurality of ramp clock signals $f_{ramp\_clk}$<3:0> 324 according to Equation (8) below:

$$I_{integ} = \frac{N}{M} f_{sc} C_{sw} V_{cap} = \frac{N}{M} f_{ramp\_clk} C_{sw} V_{cap} \quad (8)$$

where it can be assumed that the frequency $f_{sc}$ of the first switched capacitor control signal sc_ctrl ($f_{sc}$) 341A and the second switched capacitor control signal sc_ctrl_b ($f_{sc}$) 341B are substantially equal to the frequency of the plurality of ramp clock signals $f_{ramp\_clk}$<3:0> 324. Therefore, as shown in Equation (8) above, the integrator current $I_{integ}$ 311 can adjusted by controlling either $V_{ramp\_clk}$ or $C_{sw}$ assuming that N, M, and $V_{cap}$ are constant. By adjusting the integrator current $I_{integ}$ 311, the slope of the ramp signal VRAMP 326 is adjusted, which therefore adjusts the gain of ramp generator circuit 318, as discussed above in Equation (2) above.

Thus, Table 1 below shows analog coarse gain adjustments of 1×, 2×, or 4× that can be set by selecting the frequencies for the plurality of ramp clock signals $f_{ramp\_clk}$<3:0> 324 as shown:

TABLE 1

| Coarse Gain | $f_{ramp\_clk}$<0> | $f_{ramp\_clk}$<1> | $f_{ramp\_clk}$<2> | $f_{ramp\_clk}$<3> |
|---|---|---|---|---|
| 1× | $f_{div1}$ | $f_{div1}$ | $f_{div1}$ | $f_{div1}$ |
| 2× | $f_{div2}$ | $f_{div2}$ | $f_{div2}$ | $f_{div2}$ |
| 4× | $f_{div4}$ | $f_{div4}$ | $f_{div4}$ | $f_{div4}$ |

The frequencies of $f_{div1}$, $f_{div2}$, or $f_{div4}$ as shown in Table 1 can be selected by the multiplexor 278 in FIG. 2C accordingly. For instance, referring briefly back to FIG. 2C, the $f_{div1}$ frequency can be selected by the frequency select signal freq_sel<1:0> 280 by selecting the first bits BIT0 $f_{div1}$<3:0> 272 input of the multiplexor 278. The $f_{div2}$ frequency can be selected by the frequency select signal freq_sel<1:0> 280 by selecting the second bits BIT1 $f_{div2}$<3:0> 274 input of the multiplexor 278. The $f_{div4}$ frequency can be selected by the frequency select signal freq_sel<1:0> 280 by selecting the third bits BIT2 $f_{div4}$<3:0> 272 input of the multiplexor 278.

Table 2 below shows analog coarse gain adjustments of 1×, 2×, or 4× that can be set by controlling the $C_{sw}$ capacitance by selecting the frequencies for the plurality of ramp clock signals $f_{ramp\_clk}$<3:0> 324 as shown:

TABLE 2

| Coarse Gain | $f_{ramp\_clk}$<0> | $f_{ramp\_clk}$<1> | $f_{ramp\_clk}$<2> | $f_{ramp\_clk}$<3> |
|---|---|---|---|---|
| 1× | $f_{div1}$ | $f_{div1}$ | $f_{div1}$ | $f_{div1}$ |
| 2× | $f_{div1}$ | $f_{div1}$ | DC | DC |
| 4× | $f_{div1}$ | DC | DC | DC |

The frequency of $f_{div1}$ can be selected by the multiplexor 278 in FIG. 2C to switch the first and second switched capacitor circuits 325 and 327. The $f_{div1}$ frequency shown in Table 2 above can be selected by the frequency select signal freq_sel<1:0> 280 by selecting the first bits BIT0 $f_{div1}$<3:0> 272 input of the multiplexor 278. The 'DC' setting shown in Table 2 above refers to a DC signal, which therefore results in no switching of the corresponding first and second switched capacitor circuits 325 and 327 in accordance with the teachings of the present invention.

Figure 3B:
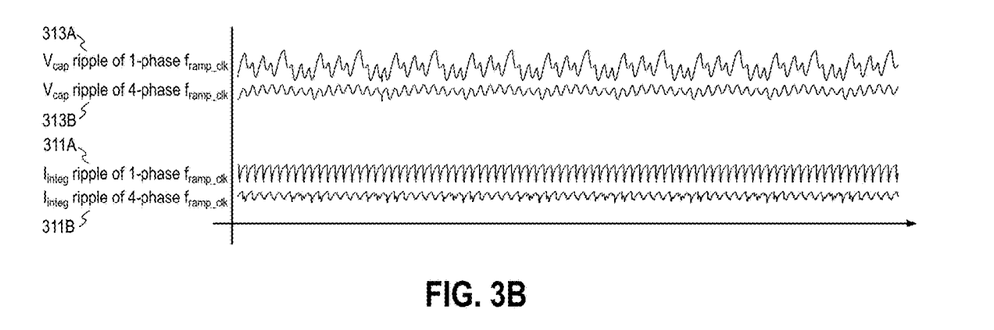
FIG. 3B is a timing diagram that illustrates a comparison of the ripple in voltage in current when using a different number of phases in the ramp clock signals in accordance with the teachings of the present invention.

FIG. 3B is a timing diagram that illustrates a comparison of the ripple in voltage in current when using a different number of phases in the ramp clock signals in accordance with the teachings of the present invention. In particular, FIG. 3B shows the $V_{cap}$ voltage ripple with a 1-phase $f_{ramp\_clk}$ signal 313A relative to the $V_{cap}$ voltage ripple with a 4-phase $f_{ramp\_clk}$ signal 313B. In addition, FIG. 3B shows the $I_{integ}$ current ripple with a 1-phase $f_{ramp\_clk}$ signal 311A relative to the $I_{integ}$ current ripple with a 4-phase $f_{ramp\_clk}$ signal 311B. It is appreciated that the $V_{cap}$ voltages and $I_{integ}$ currents illustrated FIG. 3B may be examples of the $V_{cap}$ voltages and $I_{integ}$ currents shown in FIG. 3A, and that similarly named and numbered elements described above are coupled and function similarly below.

As can be appreciated in FIG. 3B, by providing a plurality of fractional dividers (e.g., four fractional dividers 230<1-4> as illustrated in the example of FIG. 2A) and generating a plurality of ramp clock signal $f_{ramp\_clk}$ phases (e.g., four $f_{ramp\_clk}$<1-4> clock signal phases in FIG. 3A) with skews, excessive row temporal noise (RTN) caused by the delta-sigma modulators 234 can be reduced. The amount of skew can be adjusted by controlling the enable skew signals div_en_skew<3:0> 240 as discussed in FIG. 2A. As can be appreciated in the timing diagram illustrated in FIG. 3B, the ripple in the $V_{cap}$ voltages and $I_{integ}$ currents can be significantly reduced when utilizing the four phase $f_{ramp\_clk}$ signals in accordance with the teachings of the present invention.

Figure 4A:
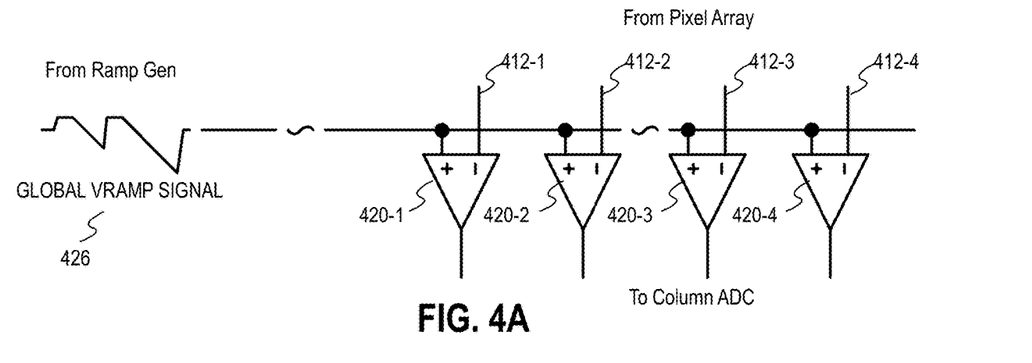
FIG. 4A illustrates a schematic that shows an example of column comparators coupled to receive image signals from bitlines and a ramp signal from a ramp generator in accordance with the teachings of the present invention.

FIG. 4A illustrates a schematic that shows an example of column comparators 420 in accordance with the teachings of the present invention. It is appreciated that the column comparators 420 illustrated FIG. 4A may be examples of the column comparators 120 shown in FIG. 1, and that similarly named and numbered elements described above are coupled and function similarly below. As shown in the example depicted in FIG. 4A, 420-1, 420-2, . . . , 420-3, and 420-4 are coupled to column bitlines 412-1, 412-2, . . . , 412-3, and 412-4 to receive analog image signals from the respective column of pixel cells (e.g., pixel cells 104 of pixel array 102 in FIG. 1) and further coupled to receive a global ramp signal VRAMP 426, which occurs during an analog to digital conversion operation of the ADC. In the example, the outputs of the plurality of comparators 420-1, 420-2, . . . , 420-3, and 420-4 are coupled in parallel to the column ADC (e.g., column ALUs included in column ADC 122 of FIG. 1).

In operation, each one of the column comparators 420-1, 420-2, . . . , 420-3, and 420-4 is coupled to generate a respective comparator output in response to a comparison of the respective analog image data signal received from the respective column bitline 412-1, 412-2, . . . , 412-3, and 412-4 and the global ramp signal VRAMP 426. In one example, when the voltage of the global ramp signal VRAMP 426 ramps down to a value equal to or less than the voltage of the analog image data signal carried by the respective column bit line 412-1, 412-2, . . . , 412-3, and 412-4, an edge (e.g., falling edge) occurs at the output of the respective column comparator 420-1, 420-2, . . . , 420-3, and 420-4, which is coupled to be received by the column ADC.

Figure 4B:
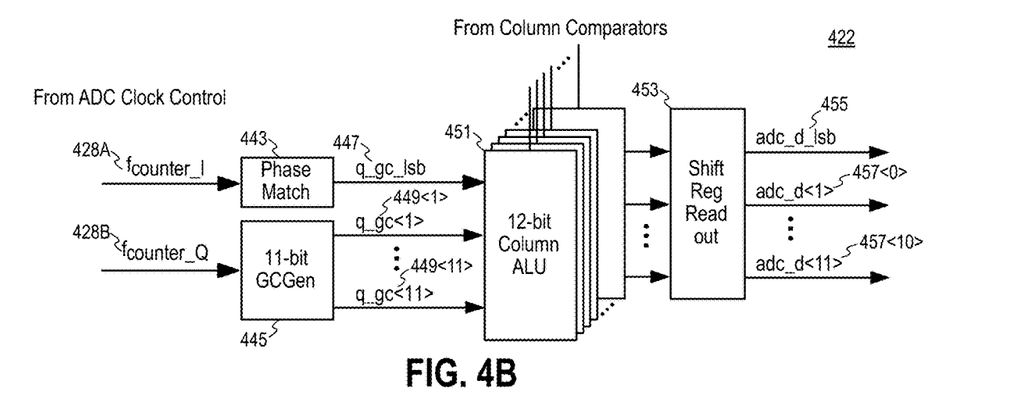
FIG. 4B illustrates a schematic that shows an example of a column ADC coupled to outputs of column comparators and coupled to receive counter clock signals from an ADC clock control in accordance with the teachings of the present invention.

FIG. 4B illustrates a schematic that shows an example of a column ADC 422 coupled to outputs of column comparators (e.g., comparators 420-1, 420-2, . . . , 420-3, 420-4 of FIG. 4A) and coupled to receive counter clock signals from an ADC clock control (in-phase counter clock signal 228A and quadrature counter clock signal 228B from ADC clock control 216 of FIG. 2A) in accordance with the teachings of the present invention. It is appreciated that the column ADC 422 illustrated FIG. 4B may be an example of the column ADC 122 shown in FIG. 1, and that similarly named and numbered elements described above are coupled and function similarly below.

As shown in the example depicted in FIG. 4B, column ADC 422 includes a phase match circuit 443, which is coupled to receive an in-phase counter clock signal 428A, and is configured to generate a least significant bit q_gc_lsb 447 of a count signal of the column ADC 422. An M-bit Gray code generator 445 is coupled to receive a quadrature counter clock signal 428B, and is configured to generate an upper M-bits q_gc<1> 449<1>, . . . , q_gc<11> 449<11> of the count signal of the column ADC 422. In the depicted example, M=11 such that Gray code generator is an 11 bit Gray code generator. A plurality of M+1 bit column arithmetic logic units (ALUs) 451 are coupled to receive the least significant bit q_gc_lsb 447 of the count signal of the column ADC 422 and the upper M-bits q_gc<1> 449<1>, . . . , q_gc<11> 449<11> of the count signal of the column ADC 422. In the depicted example, the column ALUs 451 are 12 bit ALUs. In the example, the plurality of M+1 bit column ALUs 451 are further coupled to the column comparators to generate the digital image data adc_d_lsb 455, adc_d<1> 457<1>, . . . , adc_d<11> 457<11> in response to the column comparators and the count signal of the column ADC 422. In the example, a shift register readout circuit 453 coupled to the plurality of M+1 bit column ALUs 451 to readout the digital image data adc_d_lsb 455, adc_d<1> 457<1>, . . . , adc_d<11> 457<11> from the plurality of M+1 bit column ALUs 451.

In operation, each respective column ALU 451 is coupled to sample and hold, or latch, the 12-bit Gray code count signal q_gc_lsb 447, q_gc<1> 449<1>, . . . , q_gc<11> 449<11> received from the phase match circuit 443 and the 11 bit Gray code generator 445 when the falling edge occurs at the output of the respective column comparator that is coupled to the respective column ALU 451. In various examples, the column ALUs 451 may also be coupled perform correlated double sampling (CDS) operations in parallel on sampled and held reset (SHR) value samplings and sampled and held signal (SHS) samplings from the respective column bit lines 412-1, 412-2, . . . , 412-3, 412-4 to generate normalized digital image signal data from the image sensor in accordance with the teachings of the present invention. In one example, the digital image data adc_d_lsb 455, adc_d<1> 457<1>, . . . , adc_d<11> 457<11> generated from the column ALUs 453 and readout by shift register readout circuit 453 may then be output to respective global read bit lines of the readout circuit 106.

When performing CDS, it is appreciated that quantization noise can be reduced by half by performing the subtraction (e.g., subtracting the sampled and held reset (SHR) sampling from the sampled and held signal (SHS) sampling) with an additional bit, such as for example the least significant bit q_gc_lsb 447, by using an 11 bit ADC with 12 bit CDS processing in accordance with the teachings of the present invention. In order to keep the same analog to digital conversion time with the additional bit, the counter clock signal (e.g., $f_{counter}$ 252) from the ADC clock control circuit would need to be doubled. However, with the inclusion of in-phase/quadrature (I/Q) clock circuit 254 in the ADC clock control circuit 216 as discussed above in FIG. 2A, an in-phase counter clock signal $f_{counter\_I}$ 428A and a quadrature counter clock signal $f_{counter\_Q}$ 428B are coupled to be received by column ADC 422, which effectively provides a doubled counter clock speed in accordance with the teachings of the present invention.

Figure 4C:
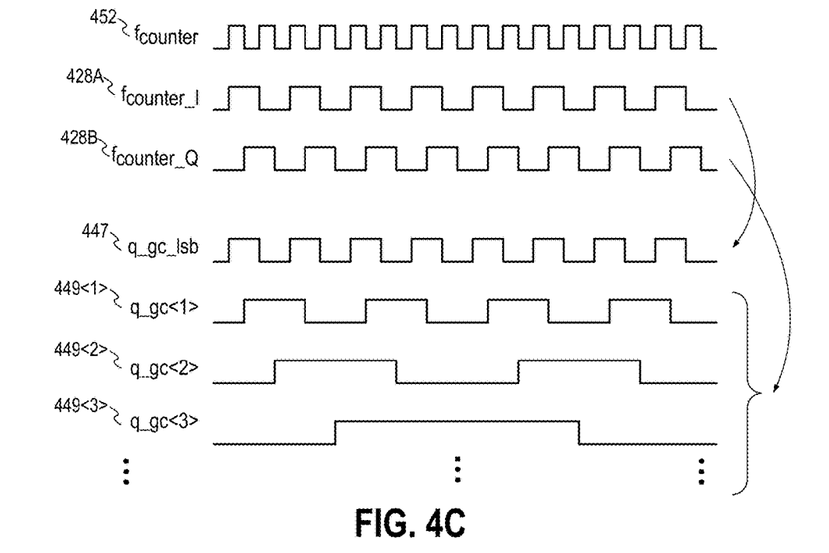
FIG. 4C is a timing diagram that illustrates counter clock signals and counter signals in a column ADC in accordance with the teachings of the present invention.

To illustrate, FIG. 4C is a timing diagram that illustrates counter clock signals and count signals in a column ADC in accordance with the teachings of the present invention. It is appreciated that the counter clock signals and count signals shown in FIG. 4C are examples of counter clock signals and count signals in a column ADC shown in FIG. 4B or counter clock signals shown in FIG. 2A, and that similarly named and numbered elements described above are coupled and function similarly below. As shown in the depicted example, FIG. 4C shows a counter clock signal $f_{counter}$ 452, an in-phase counter clock signal $f_{counter\_I}$ 428A, a quadrature counter clock signal $f_{counter\_Q}$ 428B, a least significant bit q_gc_lsb 447, and the second, third, and fourth least significant bits q_gc<1> 449<1>, q_gc<2> 449<2>, and q_gc<3> 449<3> of a Gray code count signal of the column ADC 422.

In one example, the counter clock signal $f_{counter}$ 452, the in-phase counter clock signal $f_{counter\_I}$ 428A, and the quadrature counter clock signal $f_{counter\_Q}$ 428B of FIG. 4C are examples of the counter clock signal $f_{counter}$ 252, the in-phase counter clock signal $f_{counter\_I}$ 228A, and the quadrature counter clock signal $f_{counter\_Q}$ 228B discussed in FIG. 2A. As such, the in-phase counter clock signal $f_{counter\_I}$ 428A and the quadrature counter clock signal $f_{counter\_Q}$ 428B of FIG. 4C are generated in response to the counter clock signal $f_{counter}$ 452 by an I/Q clock circuit (e.g., I/Q clock circuit 254).

As shown in the depicted example, the in-phase counter clock signal $f_{counter\_I}$ 428A has pulses with rising edges that are in-phase with rising edges of pulses of the counter clock signal $f_{counter}$ 452. In the example, the frequency of the in-phase counter clock signal $f_{counter\_I}$ 428A is half of the frequency of the counter clock signal $f_{counter}$ 452. In the example, the quadrature counter clock signal $f_{counter\_Q}$ 428B has the same frequency as the in-phase counter clock signal $f_{counter\_I}$ 428A, but is phase-shifted relative to the in-phase counter clock signal $f_{counter\_I}$ 428A by a quarter of a cycle or 90° (i.e., π/2 radians). As such, the rising edges of the quadrature counter clock signal $f_{counter\_Q}$ 428B are in phase with falling edges of the counter clock signal $f_{counter}$ 452.

In operation, the phase match circuit 443 is coupled to receive the in-phase counter clock signal $f_{counter\_I}$ 428A to generate the least significant bit q_gc_lsb 447 of the Gray code count, which in the illustrated example is in phase with and has the same frequency as the in-phase counter clock signal $f_{counter\_I}$ 428A.

In operation, the 11-bit Gray code generator 445 is coupled to receive the quadrature counter clock signal $f_{counter\_Q}$ 428B to generate the upper 11 bits of the Gray code count q_gc<1> 449<1> to q_gc<11> 449<11>. The q_gc<1> 449<1>, q_gc<2> 449<2>, and q_gc<3> 449<3> bits are shown in FIG. 4C. As shown in the depicted example, the q_gc<1> 449<1> bit is in phase with the quadrature counter clock signal $f_{counter\_Q}$ 428B. In the example, it is appreciated that the least significant bit q_gc_lsb 447 is generated by phase match circuit 443 with a delay match to yield a proper Gray code relationship with the upper 11 bits of the Gray code count q_gc<1> 449<1> to q_gc<11> 449<11>.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A clock control circuit for use in an analog to digital converter (ADC), the clock control circuit comprising:
    a plurality of fractional divider circuits, wherein each one of the plurality of fractional divider circuits includes:
        a programmable integer divider coupled to receive an enable skew signal, a clock signal, and an output integer signal, wherein the programmable integer divider is coupled to divide down the clock signal by a factor responsive to the output integer signal to generate a fractional divider signal; and
        a delta-sigma modulator coupled to receive a fractional modulus signal, an input integer signal, and the fractional divider signal to generate the output integer signal, wherein the output integer signal is a varying signal each cycle of the fractional divider signal and having a long term average DC value substantially equal to a fractional divider ratio K; and
    an extended gain control circuit coupled to receive the fractional divider signal from each one of the plurality of fractional divider circuits, wherein the extended gain control circuit is configured to generate a plurality of ramp clock signals in response to the fractional divider signal from each one of the plurality of fractional divider circuits, wherein the plurality of ramp clock signals have a plurality of different adjustable frequency settings to adjust a gain setting of a ramp generator of the ADC.

2. The clock control circuit of claim 1, wherein the extended gain control circuit comprises:
    a plurality of ripple counters, wherein each ripple counter is coupled to receive a respective fractional divider signal from the plurality fractional divider circuits, wherein each ripple counter includes a plurality of cascade-coupled flip flops, wherein each of the flip flops configured to generate a respective bit of an N bit ripple counter output in response to the respective fractional divider signal; and
    a multiplexer coupled receive the respective bits from the plurality of cascaded flip flops of the plurality of ripple counters, wherein the multiplexer is configured to select one of the respective bits from the plurality of cascaded flip flops of the plurality of ripple counters in response to a frequency select signal to generate the plurality of ramp clock signals.

3. The clock control circuit of claim 2, wherein the multiplexer is configured to select one of first bits, second bits, or third bits from the plurality of cascaded flip flops of the plurality of ripple counters in response to the frequency select signal to generate the plurality of ramp clock signals, wherein a frequency of the second bits is half a frequency of the first bits, wherein a frequency of the third bits is half the frequency of the second bits.

4. The clock control circuit of claim 2, wherein each ripple counter comprises:
    a first flip flop configured to generate a first bit in response to the respective fractional divider signal, wherein the first bit is coupled to be received by a first multiplexer input of the multiplexer;
    a second flip flop configured to generate the second bit in response to the first bit from the first flip flop, wherein the second flip flop further includes an input coupled to receive an inverted output of the second flip flop, wherein the second bit is coupled to be received by a second multiplexer input of the multiplexer; and
    a third flip flop configured to generate the third bit in response to the second bit from the second flip flop, wherein the third flip flop further includes an input coupled to receive an inverted output of the third flip flop, wherein the third bit is coupled to be received by a third multiplexer input of the multiplexer,
    wherein the multiplexer is configured to select one of the first multiplexer input, second multiplexer input, or third multiplexer input in response to the frequency select signal to generate the plurality of ramp clock signals.

5. The clock control circuit of claim 4, wherein the first flip flop, the second flip flop, and third flip flop of each ripple counter are further configured to receive a reset signal to reset each ripple counter.

6. The clock control circuit of claim 1, wherein the programmable integer divider comprises:
    a programmable counter coupled to receive the enable skew signal, the clock signal, and the output integer signal to generate a programmable counter output signal, wherein the programmable counter output signal includes a plurality of pulses; and
    a pulse width extender coupled to receive the programmable counter output signal to generate the fractional divider signal, wherein pulse width extender is configured to extend each one of the plurality of pulses in the fractional divider signal to a fixed duration for each first state of the fractional divider signal, and wherein each second state of the fractional divider signal has a variable duration.

7. The clock control circuit of claim 6, wherein each first state of the fractional divider signal is a logic high signal value, and wherein each second state of the fractional divider signal is a logic low signal value.

8. The clock control circuit of claim 1, further comprising:
a clock gating circuit coupled to receive the clock signal and a count enable signal, wherein the clock gating circuit is configured to generate a counter clock signal in response to the clock signal and the count enable signal; and
an in-phase/quadrature (I/Q) clock circuit coupled to receive the counter clock signal from the clock gating circuit, wherein the I/Q clock circuit is configured to generate an in-phase counter clock signal and a quadrature counter clock signal in response to the counter clock signal, wherein the quadrature counter clock signal is phase-shifted relative to the in-phase counter clock signal by 90 degrees, wherein a count signal of a column ADC is configured to be generated in response to the in-phase counter clock signal and the quadrature counter clock signal.

9. An imaging system, comprising:
a pixel array including a plurality of pixel cells arranged in a plurality of rows and a plurality of columns, wherein the pixel cells are configured to generate image signals in response to incident light;
a control circuit coupled to the pixel array to control operation of the pixel array; and
a readout circuit coupled to the pixel array to read out the image signals from the plurality of pixel cells through bitlines, wherein the readout circuit includes an analog to digital converter (ADC) to generate digital image data in response to the image signals received from the plurality of pixel cells, wherein the ADC comprises:
  column comparators coupled to the bitlines to receive the image signals from the plurality of pixel cells and further coupled to receive a ramp signal during an analog to digital conversion operation of the ADC;
  a ramp generator coupled to generate the ramp signal with high resolution fine gain in response to a plurality of ramp clock signals with a fractional divider ratio K; and
  an analog to digital converter (ADC) clock control circuit configured to generate the plurality of ramp clock signals, the ADC clock control circuit comprising:
    a plurality of fractional divider circuits, wherein each one of the plurality of fractional divider circuits includes:
      a programmable integer divider coupled to receive an enable skew signal, a clock signal, and an output integer signal, wherein the programmable integer divider is coupled to divide down the clock signal by a factor responsive to the output integer signal to generate a fractional divider signal; and
      a delta-sigma modulator coupled to receive a fractional modulus signal, an input integer signal, and the fractional divider signal to generate the output integer signal, wherein the output integer signal is a varying signal each cycle of the fractional divider signal and having a long term average DC value substantially equal to the fractional divider ratio K; and
    an extended gain control circuit coupled to receive the fractional divider signal from each one of the plurality of fractional divider circuits, wherein the extended gain control circuit is configured to generate the plurality of ramp clock signals in response to the fractional divider signal from each one of the plurality of fractional divider circuits, wherein the plurality of ramp clock signals have a plurality of different adjustable frequency settings to adjust a gain setting of a ramp generator of the ADC.

10. The imaging system of claim 9, further comprising function logic coupled to the readout circuit to store the digital image data generated by the ADC of the readout circuit.

11. The imaging system of claim 9, wherein the extended gain control circuit comprises:
a plurality of ripple counters, wherein each ripple counter is coupled to receive a respective fractional divider signal from the plurality fractional divider circuits, wherein each ripple counter includes a plurality of cascade-coupled flip flops, wherein each of the flip flops configured to generate a respective bit of an N bit ripple counter output in response to the respective fractional divider signal; and
a multiplexer coupled receive the respective bits from the plurality of cascaded flip flops of the plurality of ripple counters, wherein the multiplexer is configured to select one of the respective bits from the plurality of cascaded flip flops of the plurality of ripple counters in response to a frequency select signal to generate the plurality of ramp clock signals.

12. The imaging system of claim 11, wherein the multiplexer is configured to select one of first bits, second bits, or third bits from the plurality of cascaded flip flops of the plurality of ripple counters in response to the frequency select signal to generate the plurality of ramp clock signals, wherein a frequency of the second bits is half a frequency of the first bits, wherein a frequency of the third bits is half the frequency of the second bits.

13. The imaging system of claim 11, wherein each ripple counter comprises:
a first flip flop configured to generate a first bit in response to the respective fractional divider signal, wherein the first bit is coupled to be received by a first multiplexer input of the multiplexer;
a second flip flop configured to generate the second bit in response to the first bit from the first flip flop, wherein the second flip flop further includes an input coupled to receive an inverted output of the second flip flop, wherein the second bit is coupled to be received by a second multiplexer input of the multiplexer; and
a third flip flop configured to generate the third bit in response to the second bit from the second flip flop, wherein the third flip flop further includes an input coupled to receive an inverted output of the third flip flop, wherein the third bit is coupled to be received by a third multiplexer input of the multiplexer,
wherein the multiplexer is configured to select one of the first multiplexer input, second multiplexer input, or third multiplexer input in response to the frequency select signal to generate the plurality of ramp clock signals.

14. The imaging system of claim 13, wherein the first flip flop, the second flip flop, and third flip flop of each ripple counter are further configured to receive a reset signal to reset each ripple counter.

15. The imaging system of claim 9, wherein the programmable integer divider comprises:
a programmable counter coupled to receive the enable skew signal, the clock signal, and the output integer signal to generate a programmable counter output signal, wherein the programmable counter output signal includes a plurality of pulses; and a pulse width extender coupled to receive the programmable counter output signal to generate the fractional divider signal, wherein pulse width extender is configured to extend each one of the plurality of pulses in the fractional divider signal to a fixed duration for each first state of the fractional divider signal, and wherein each second state of the fractional divider signal has a variable duration.

16. The imaging system of claim 15, wherein each first state of the fractional divider signal is a logic high signal value, and wherein each second state of the fractional divider signal is a logic low signal value.

17. The imaging system of claim 9, wherein the ramp generator comprises:
a current mirror having a first path coupled to conduct a capacitor current, and a second path coupled to conduct an integrator current responsive to the capacitor current;
an integrator coupled to the second path to generate the ramp signal in response to the integrator current; and
a plurality of switching circuits coupled to the first path, wherein each one of the plurality of switching circuits comprises:
a first switched capacitor circuit and a second switched capacitor circuit coupled to the first path; and
a non-overlap clock generator coupled to receive a respective one of the plurality of ramp clock signals to generate a first switched capacitor control signal that oscillates between a first state and a second state, and a second switched capacitor control signal that oscillates between the second state and the first state, wherein the first switched capacitor circuit is coupled to be charged by the capacitor current and the second switched capacitor circuit is coupled to be discharged in response to each first state of the first switched capacitor control signal and each second state of the second switched capacitor control signal, wherein the first switched capacitor circuit is coupled to be discharged and the second switched capacitor circuit is coupled to be charged by the capacitor current in response to each second state of the first switched capacitor control signal and each first state of the second switched capacitor control signal.

18. The imaging system of claim 17, wherein the first switched capacitor circuit comprises:
a first capacitor;
a first switch coupled between the first capacitor and the first path, wherein the first switch is configured to be turned on in response to the first state of the first switched capacitor control signal and turned off in response to the second state of the first switched capacitor control signal; and
a second switch coupled across the first capacitor, wherein the second switch is configured to be turned off in response to the second state of the second switched capacitor control signal and turned on in response to the first state of the second switched capacitor control signal.

19. The imaging system of claim 18, wherein the second switched capacitor circuit comprises:
a second capacitor;
a third switch coupled between the second capacitor and the first path, wherein the third switch is configured to be turned off in response to the second state of the second switched capacitor control signal and turned on in response to the first state of the second switched capacitor control signal; and a fourth switch coupled across the second capacitor, wherein the fourth switch is configured to be turned on in response to the first state of the first switched capacitor control signal and turned off in response to the second state of the first switched capacitor control signal.

20. The imaging system of claim 17, wherein the current mirror comprises:
a first transistor coupled between a voltage supply rail and the first path, wherein a control terminal of the first transistor is coupled to the first path; and
a second transistor coupled between the voltage supply rail and the second path, wherein a control terminal of the second transistor is coupled to the control terminal of the first transistor.

21. The imaging system of claim 20, wherein the ramp generator further comprises:
a first operational amplifier having a non-inverting input coupled to a reference capacitor voltage; and
a third transistor coupled between the first transistor and the plurality of switching circuits and the inverting input of the first operational amplifier coupled to the first path, wherein a control terminal of the third transistor is coupled to an output of the first operational amplifier, and wherein the first operational amplifier is coupled to regulate the control terminal of the third transistor in response to a voltage at the plurality of switching circuits reaching the reference capacitor voltage.

22. The imaging system of claim 21, wherein the integrator comprises:
a second operational amplifier having a non-inverting input coupled to a reference voltage;
a third capacitor coupled between an inverting input of the second operational amplifier and an output of the second operational amplifier; and
a fifth switch coupled between the inverting input of the second operational amplifier and the output of the second operational amplifier, wherein the integrator is coupled to be reset in response to the fifth switch, and wherein the ramp signal is configured to be generated at the output of the second operational amplifier.

23. The imaging system of claim 22, wherein the ramp generator further comprises a fine grain transistor coupled between the first transistor and the third transistor, wherein the fine grain transistor is configured to be controlled in response to a fine grain signal.

24. The imaging system of claim 23, wherein the ramp generator further comprises a ramp code transistor coupled between the second transistor and the integrator, wherein the ramp code transistor is configured to be controlled in response to a ramp code signal.

25. The imaging system of claim 24, wherein the ramp generator further comprises a gate sample switch coupled between the control terminal of the first transistor and the control terminal of the second transistor, wherein the gate sample switch is configured to be controlled in response to a gate sample signal and an inverted gate sample signal.

26. The imaging system of claim 9, wherein the ADC further comprises a column ADC coupled to the column comparators and the ADC clock control, wherein the ADC clock control further comprises:
a clock gating circuit coupled to receive the clock signal and a count enable signal, wherein the clock gating circuit is configured to generate a counter clock signal in response to the clock signal and the count enable signal; and an in-phase/quadrature (I/Q) clock circuit coupled to receive the counter clock signal from the clock gating circuit, wherein the I/Q clock circuit is configured to generate an in-phase counter clock signal and a quadrature counter clock signal in response to the counter clock signal, wherein the column ADC is coupled to receive the in-phase counter clock signal and the quadrature counter clock signal, wherein the quadrature counter clock signal is phase-shifted relative to the in-phase counter clock signal by 90 degrees, wherein a count signal of the column ADC is configured to be generated in response to the in-phase counter clock signal and the quadrature counter clock signal.

27. The imaging system of claim 26, wherein the column ADC comprises:

a phase match circuit coupled to receive the in-phase counter clock signal and configured to generate a least significant bit of the count signal of the column ADC;

an M-bit Gray code generator coupled to receive the quadrature counter clock signal and configured to generate an upper M-bits of the count signal of the column ADC;

a plurality of M+1 bit column arithmetic logic units (ALUs) coupled to receive the least significant bit of the count signal of the column ADC and the upper M-bits of the count signal of the column ADC, wherein the plurality of M+1 bit column ALUs are further coupled to the column comparators to generate the digital image data in response to the column comparators and the count signal of the column ADC; and a shift register readout circuit coupled to the plurality of M+1 bit column ALUs to readout the digital image data from the plurality of M+1 bit column ALUs.

* * * * *